US006596579B1

(12) United States Patent
Randazzo et al.

(10) Patent No.: US 6,596,579 B1
(45) Date of Patent: Jul. 22, 2003

(54) METHOD OF FORMING ANALOG CAPACITOR DUAL DAMASCENE PROCESS

(75) Inventors: Todd A. Randazzo, Colorado Springs, CO (US); Kenneth P. Fuchs, Colorado Springs, CO (US); John de Q. Walker, Colorado Springs, CO (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/844,531

(22) Filed: Apr. 27, 2001

(51) Int. Cl.[7] .......................................... H01L 21/8242

(52) U.S. Cl. ...................................... 438/253; 438/396

(58) Field of Search ............................ 438/3, 238–240, 438/250–256, 381, 393–399

(56) References Cited

U.S. PATENT DOCUMENTS 5,580,814 A * 12/1996 Larson ......................... 438/3
6,511,874 B2 * 1/2003 Zambrano .................. 438/239

* cited by examiner

*Primary Examiner*—Jey Tsai
(74) *Attorney, Agent, or Firm*—Luedeka, Neely & Graham, PC

(57) ABSTRACT

A process for forming a capacitive structure that includes an upper layer having a first capacitor electrode section therein. A capacitor dielectric layer is formed adjacent the upper layer. The capacitor dielectric layer covers the first capacitor electrode section. A second capacitor electrode layer is formed adjacent the capacitor dielectric layer. The second capacitor electrode layer includes a second capacitor electrode section that at least partially covers the first capacitor electrode section, and which has an edge portion that extends beyond the underlying first capacitor electrode section. The capacitor dielectric layer being disposed between the first capacitor electrode section and the second capacitor electrode section. An upper dielectric layer is formed adjacent the second capacitor electrode section. Portions of the upper dielectric layer and the second capacitor electrode section are selectively removed to form a first via cavity that extends through the upper dielectric layer and the edge portion of the second capacitor electrode section. This exposes the edge portion of the second capacitor electrode section within the first via cavity. The first via cavity is filled with a via metal, which makes electrical connection with the edge portion of the second capacitor electrode section that is exposed within the first via cavity.

16 Claims, 8 Drawing Sheets

M3₁ M3₂ M3₃ V2₁ V2₂ V2₃ L4 M2₁ M2₂ M2₃ M2₄ ILD2 V1₁ V1₂ ILD1 M1₁ M1₂

METHOD OF FORMING ANALOG CAPACITOR DUAL DAMASCENE PROCESS

FIELD

This invention relates to the field of integrated circuit fabrication. More particularly, the invention relates to forming metal-insulator-metal capacitor structures in a dual damascene fabrication process.

BACKGROUND

Processes for forming a metal-insulator-metal capacitor in a copper dual damascene process in an integrated circuit, such as a complimentary metal oxide semiconductor structure, generally require etching a via through an intermetal dielectric layer to expose a copper top plate of the capacitor. Another via generally must be etched through the intermetal dielectric layer and through a capacitor dielectric layer to expose a copper bottom plate of the capacitor. In prior processes, the etching step to form the vias had to be carefully controlled to ensure that the etching of the via to the top plate did not break through the capacitor dielectric and into the bottom plate, thereby causing an electrical short between the top and bottom plates. To help prevent such etch-through, the top plate was made relatively thick, such as about 1000–1400 angstroms. However, thickening the capacitor top plate introduced difficulties in subsequent dual damascene process steps for forming conductor trenches.

What is needed, therefore, is a process for forming metal-insulator-metal capacitor structures wherein timing constraints on via etch steps may be relaxed, while at the same time minimizing the thickness of the top capacitor plate to simplify the dual damascene trench-formation processes.

SUMMARY

The above and other needs are met by a process for forming a capacitive structure that includes an upper layer having a first capacitor electrode section therein. A capacitor dielectric layer is formed adjacent to the upper layer. The capacitor dielectric layer covers the first capacitor electrode section. A second capacitor electrode layer is formed adjacent the capacitor dielectric layer. The second capacitor electrode layer includes a second capacitor electrode section that at least partially covers the first capacitor electrode section, and which has an edge portion that extends beyond the underlying first capacitor electrode section. The capacitor dielectric layer being disposed between the first capacitor electrode section and the second capacitor electrode section.

An upper dielectric layer is formed adjacent the second capacitor electrode section. Portions of the upper dielectric layer, and possibly the second capacitor electrode section, are selectively removed to form a first via cavity that extends through the upper dielectric layer and possibly into or through the edge portion of the second capacitor electrode section. This exposes the edge portion of the second capacitor electrode section within the first via cavity. The first via cavity is filled with a via metal, which makes electrical connection with the edge portion of the second capacitor electrode section that is exposed within the first via cavity.

Because the edge portion of the top electrode layer does not overlie the bottom electrode layer, it is not necessary to stop the via etch exactly at the top surface of the top electrode layer, as is typically required. Thus, the typical constraints in regard to etch selectively when drilling the vias through the dielectric layer overlying the top electrode are no longer applicable. This allows for a more robust integration of capacitor processing with dual damascene copper processing. Further, because the top electrode layer does not need to function as an etch stop for the via drilling process, the top electrode layer can be of any material desired that is compatible with the other processing constraints and desired functions. In addition, the top electrode layer may be formed at a thickness that is much thinner than prior art top electrode layers that needed to function as an etch stop. Further, additional layers adjacent or near the top electrode layer, which function only or primarily as etch stops, are also no longer required.

In another aspect, the invention provides an integrated circuit having a capacitor formed according to the process described above.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Referring now to FIGS. 1A–1J and FIGS. 2A and 2B, the steps of an integrated circuit fabrication process according to a preferred embodiment of the invention are generally depicted. Described below are the major steps in the process according to the invention. Other steps not described in detail herein may also be required to complete the processing, such as photoresist removal and rinsing steps.

Figure 1A:
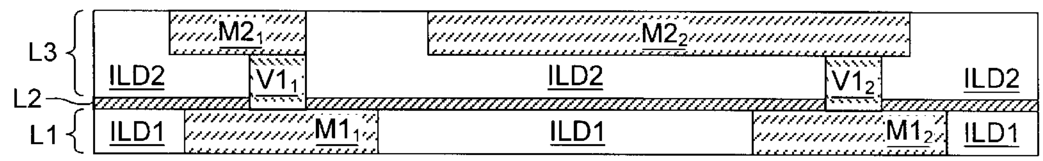
FIGS. 1A–1J depict a metal-insulator-metal capacitor structure formed using a dual damascene process according to a preferred embodiment of the invention.

The steps of the process described below are preferably performed on a structure such as depicted FIG. 1A. This starting structure preferably includes layers L1, L2, and L3, as described below. Layer L1 preferably includes metal sections $M1_1$ and $M1_2$ separated by a dielectric region ILD1. Layer L3 preferably includes metal sections M2, and $M2_2$ separated by a dielectric region ILD2. The metal sections $M1_{1,\ M1}2$, $M2_1$, and $M2_2$ may be formed from various metals, such as copper or aluminum, but are most preferably formed from copper. The dielectric regions ILD1 and ILD2 are preferably formed from silicon dioxide or a low dielectric constant (low k) insulating layer. Between layers L1 and L3 is a dielectric layer L2, such as silicon nitride or silicon carbide. As depicted in FIG. 1A, the metal sections $M1_1$ and $M1_2$ may be connected to the metal sections $M2_1$ and $M2_2$ respectively by metal vias $V1_1$ and $V1_2$ respectively. The metal section $M2_2$, which serves as a capacitor plate of the metal-insulator-metal capacitor formed according to the invention, is also referred to herein as the first capacitor electrode section or the capacitor bottom plate.

It is appreciated that the structure shown in FIG. 1A is merely an example of a structure on which the steps according to the invention may be performed. Thus, the scope of the invention is not limited by the structure on which the steps of the process are performed.

Figure 1B:
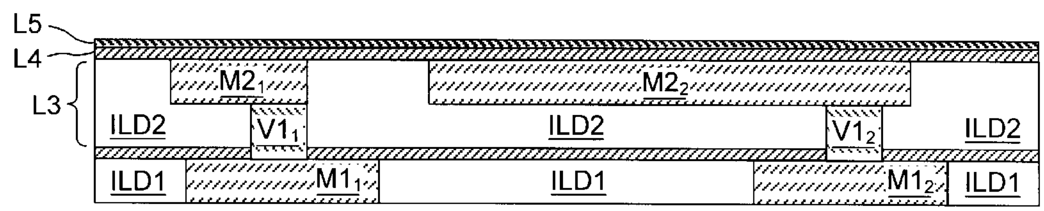
Figure 2A:
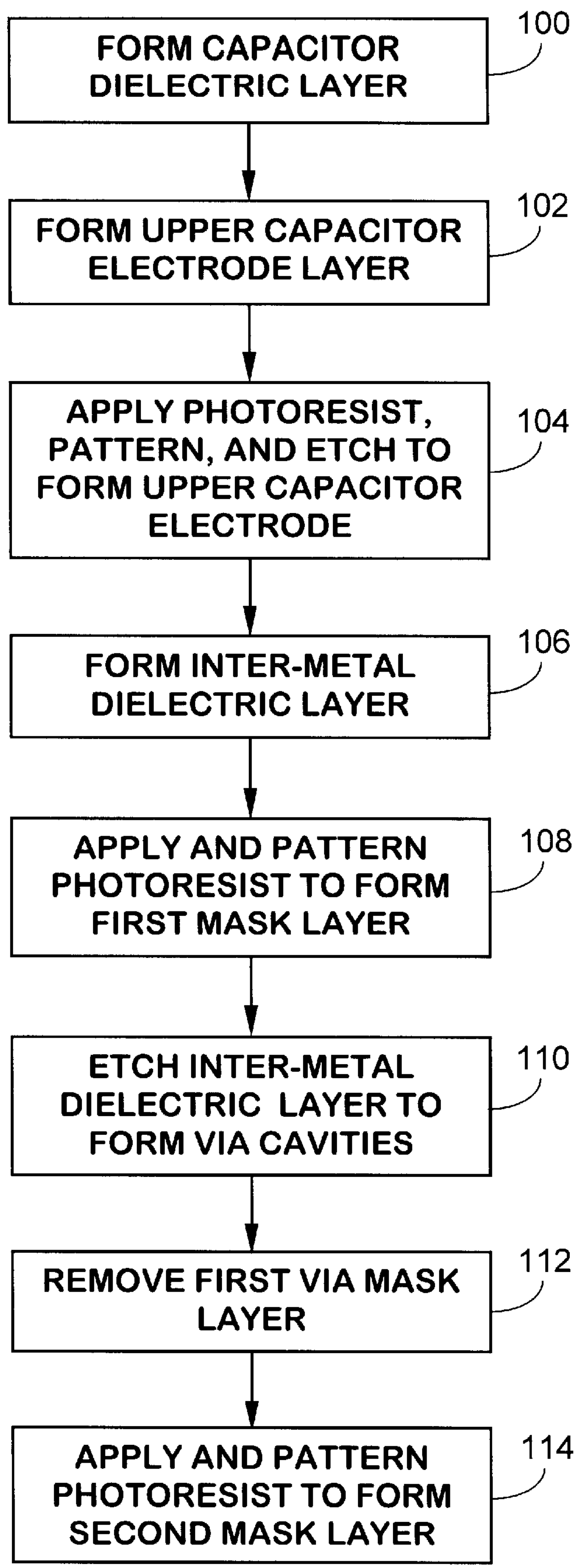
FIGS. 2A–2B depict a dual damascene process flow according to a preferred embodiment of the invention.
Figure 2B:
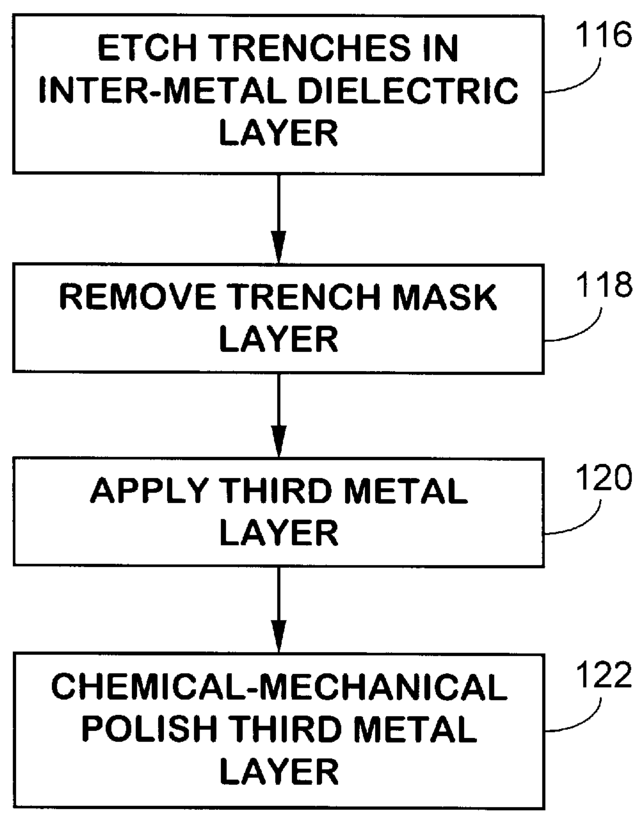

As shown in FIG. 1B, a dielectric layer L4, also referred to herein as a capacitor dielectric layer, is formed adjacent the layer L3 (step 100 of FIG. 2A). The layer L4, which is most preferably silicon nitride ($Si_3N_4$), may be formed by various processes, such as sputtering or chemical vapor deposition. As discussed in more detail hereinafter, the layer L4 serves as a dielectric separator between two conductive plates in a metal-insulator-metal capacitor formed according to the invention. Thus, the layer L4 preferably has certain dielectric properties, such as breakdown voltage and dielectric constant, that are compatible with the desired characteristics of the capacitor to be formed. Although silicon nitride provides these desired properties, other similar materials having these preferred properties may also be used. Thus, the present invention is not limited to any particular material for the capacitor-dielectric layer L4.

Although the invention is not limited to any particular thickness, the preferred thickness of the layer L4 is most preferably about four hundred angstroms. The thickness of the dielectric layer L4, which tends to have an affect on the electrical characteristics of the metal-insulator-metal capacitor, is preferably controlled by the process of depositing the layer L4 and by processes to which the layer L4 is exposed during subsequent processing steps, as discussed hereinafter.

With continued reference to FIG. 1B, a conductive layer L5, also referred to herein as a second capacitor electrode layer, is formed adjacent the layer L4 (step 102). The layer L5, which is most preferably titanium nitride (TiN), may be formed by various processes, such as sputtering or chemical vapor deposition. The preferred thickness of the layer L5 is about 250 angstroms. In alternate embodiments, the layer L5 may be formed from titanium, tantalum, or tantalum nitride, or other materials having properties consistent with the functions of the layer L5 as described herein.

Figure 1C:
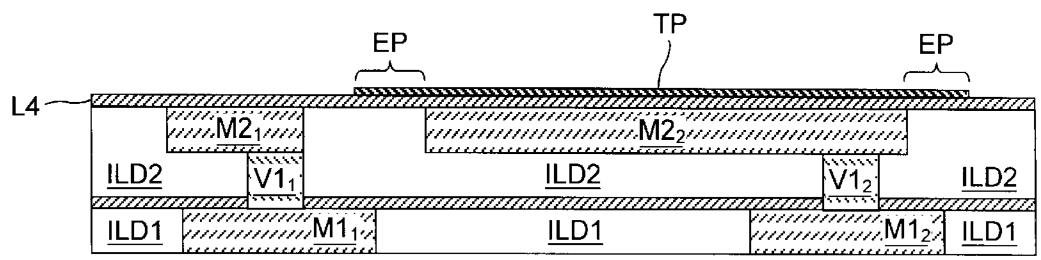

The structure as shown in FIG. 1B is patterned, such as by covered with photoresist, patterned, and etched to remove portions of the layer L5, thereby forming the structure shown in FIG. 1C (step 104). The remaining section of the layer L5 is referred to herein as the second capacitor electrode or top plate TP. As shown in FIG. 1C, the top plate TP includes one or more portions BP which extend beyond the edge of the underlying metal section $M2_2$. Note that the capacitor dielectric layer L4 can remain intact after the etching of the layer L5.

Figure 1D:
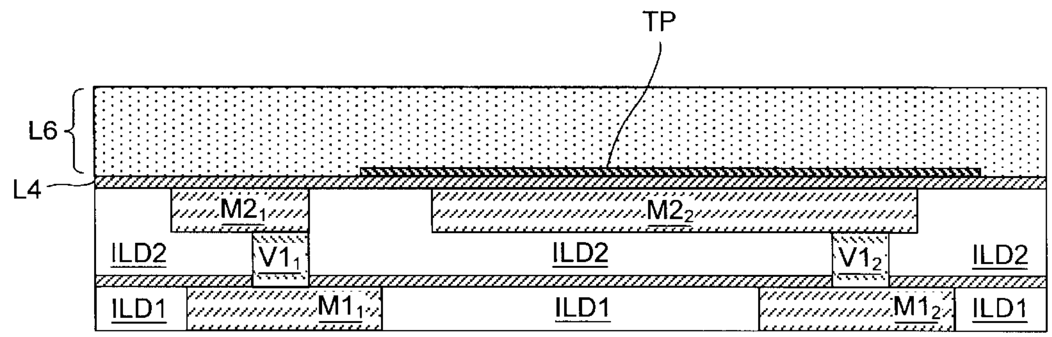

As depicted in FIG. 1D, an inter-metal dielectric layer L6 is formed over the capacitor dielectric layer L4 and the capacitor top plate TP (step 106). The layer L6, which is most preferably silicon dioxide ($SiO_2$) or a low k dielectric layer, may be formed by various processes, such as spin-on coating or chemical vapor deposition.

Figure 1E:
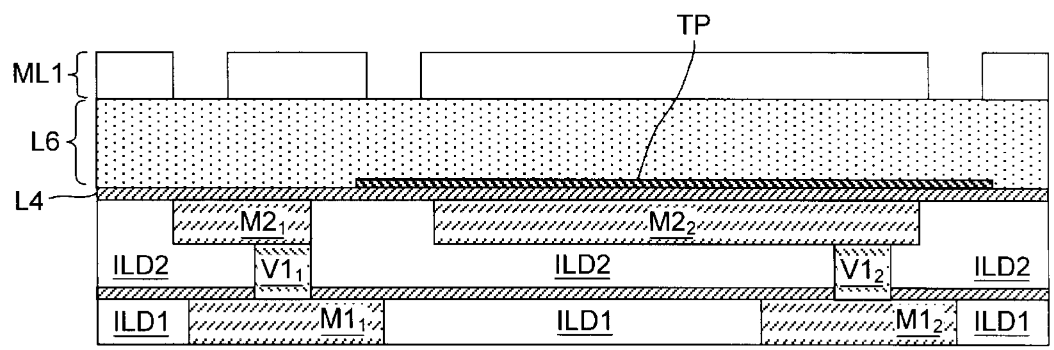

As shown in FIG. 1E, photoresist is applied and patterned (step 108) to form a first mask layer ML1, also referred to herein as a via mask. Preferably, the via mask ML1 is patterned according to standard photolithography processing to leave photoresist over portions of the layer L6 which are to remain after completion of the etching step described below.

Figure 1F:
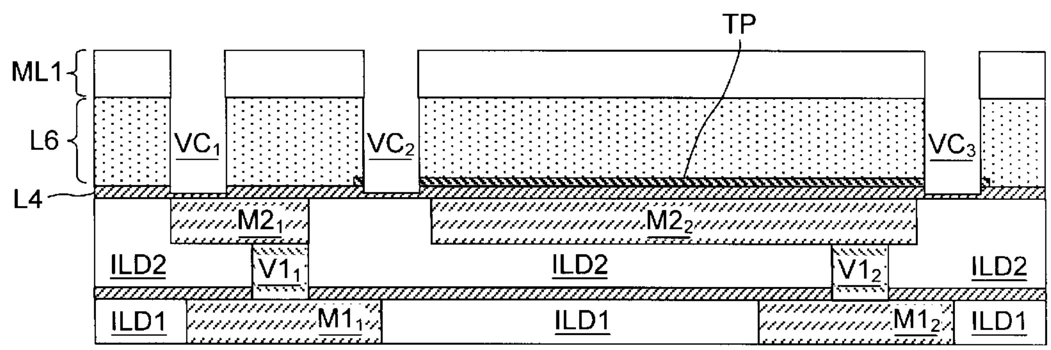

The structure as shown in FIG. 1E is exposed to an etchant to remove portions of the inter-metal dielectric layer L6 and portions of the top plate TP, thereby forming the structure shown in FIG. 1F (step 110). As shown in FIG. 1F, removal of portions of the layer L6 and the top plate TP leaves via cavities $VC_1$, $VC_2$, and $VC_3$ through which the underlying capacitor dielectric layer L4 may be exposed. This etch step may also remove portions of the capacitor dielectric layer L4. However, as discussed in more detail below, removal of some or all of the thickness of the capacitor top plate layer L5 or the capacitor dielectric layer L4 within the via cavities $VC_1$, $VC_2$, and $VC_3$ is acceptable. Thus, the timing of the duration of the via etch is not as critical as would otherwise be necessary if it were desired to stop the etch on the layer L4.

Figure 1G:
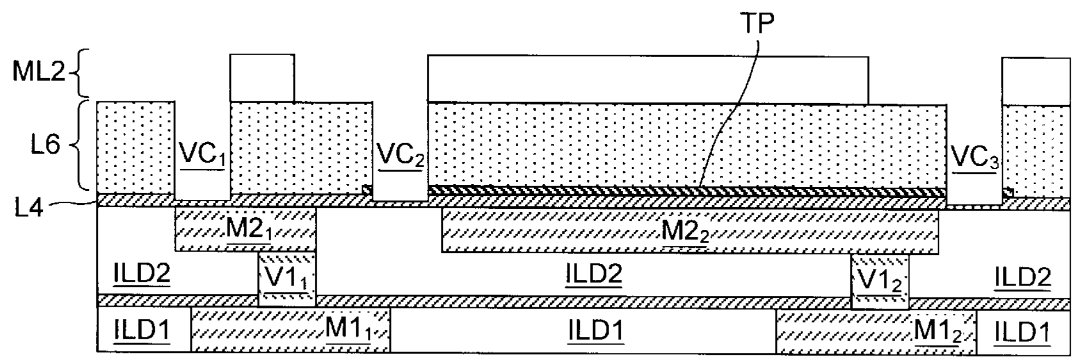

In the preferred embodiment, the via mask layer ML1 is removed (step 112), and a second application of photoresist is made. Preferably, the photoresist is patterned according to standard photolithography processing to form a trench mask layer ML2 (step 114), as shown in FIG. 1G. The trench mask layer ML2 is preferably patterned to leave photoresist over portions of the intermetallic dielectric layer L6 which are to remain after a subsequent etching step. Other portions of the layer L6 are left exposed, as shown in FIG. 1G. In the preferred embodiment, the trench mask ML2 also leaves the dielectric layer L4 exposed at the bottom of the via cavities $VC_1$, $VC_2$, and $VC_3$.

Figure 1H:
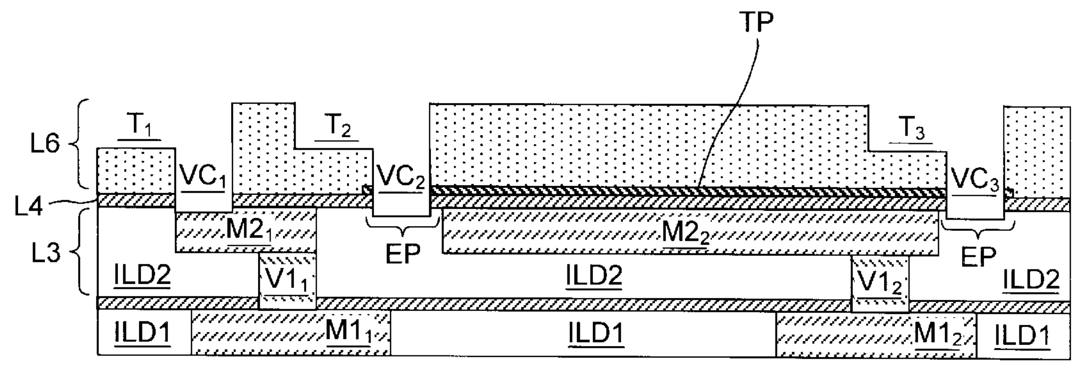
Figure 1I:
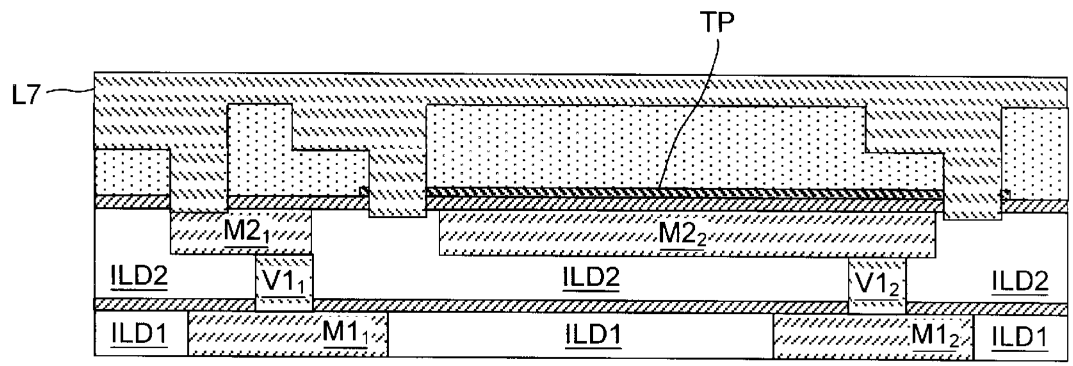

The structure as shown in FIG. 1G is exposed to an etchant to remove portions of the inter-metal dielectric layer L6 and to remove remaining portions of the capacitor dielectric layer L4 (step 116) at the bottom of the via cavities $VC_1$, $VC_2$, and $VC_3$. After removal of the trench mask layer ML2 (step 118), the structure appears as shown in FIG. 1H. The etching may be done with a single mechanical etch, such as a sputter etch, or with an etchant that does both etching steps but preferably does not etch copper. As shown in FIG. 1H, removal of the portions of the layer L6 leaves trenches $T_1$, $T_2$, and $T_3$ adjacent the via cavities $VC_1$, $VC_2$, and $VC_3$, respectively.

Removal of the portion of the capacitor dielectric layer L4 at the bottom of the via cavity $VC_1$ extends the cavity $VC_1$ down to the underlying metal section $M2_1$ of the layer L3. As shown in FIG. 1H, the etching of the portion of the capacitor dielectric layer L4 at the bottom of the via cavities $VC_2$ and $VC_3$ may completely punch through the capacitor dielectric layer L4. However, this is an acceptable situation, as described in more detail below.

As depicted in FIG. 11, metal, such as copper, aluminum, or another compatible electrically conductive material is applied to the structure to form a third metal layer L7 (step 120). The metal layer L7, which is preferably copper, may be formed by electroplating, chemical vapor deposition, sputtering, or another deposition process consistent with the materials, processes, and structures described herein. Thus, it is appreciated that the scope of the invention is not limited by the type of metal used in the layer L7, or its method of metal application.

Figure 1J:
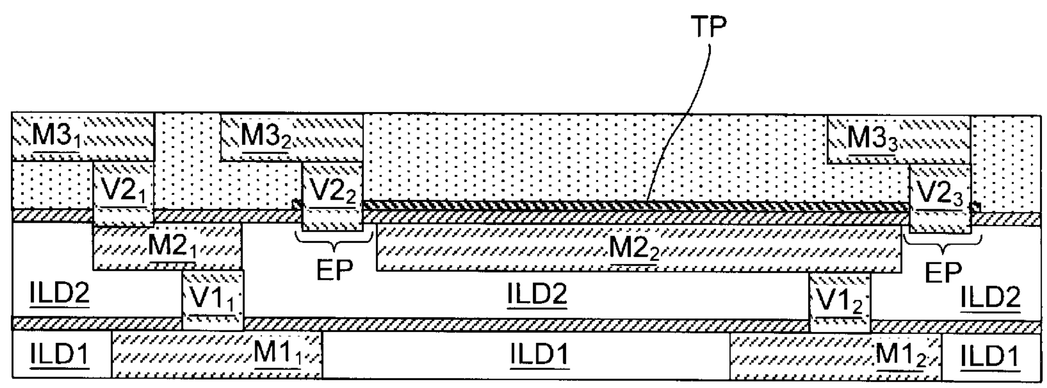

In the preferred embodiment of the invention, the structure is planarized, such as by chemical-mechanical polishing (step 122), to provide the structure as depicted in FIG. 1J. Chemical-mechanical polishing is the preferred method of planarization. The portions of the metal layer L7 disposed in the trenches $T_1$, $T_2$, and $T_3$ after the planarization step are referred to herein as electrodes $M3_1$, $M3_2$, and $M3_3$, respectively. The planarization step preferably removes any metal that has bridged the layer L6 between the electrodes $M3_1$, $M3_2$, and $M3_3$, thereby electrically isolating the electrodes $M3_1$, $M3_2$, and $M3_3$. The portions of the metal layer L7 disposed in the via cavities $VC_1$, $VC_2$, and $VC_3$ are referred to herein as vias $V2_1$, $V2_2$, and $V2_3$, respectively.

As depicted in FIG. 1J, even though the metal in the vias $V2_2$ and $V2_3$ extends below the capacitor dielectric layer L4, there is no shorting of the vias $V2_2$ and $V2_3$ to the capacitor bottom plate $M2_2$ because the regions EP of the top plate TP through which the vias $V2_2$ and $V2_3$ extend are beyond the edges of the bottom plate $M2_2$. Electrical continuity between the vias $V2_2$ and $V2_3$ and the top plate TP is established around the periphery of the vias $V2_2$ and $V2_3$.

Since the current carried by the vias $V2_2$ and $V2_3$ is preferably alternating current (AC) having no direct current (DC) component, most of the current is carried at the outer surfaces of the vias $V2_2$ and $V2_3$. Thus, the fact that the vias $V2_2$ and $V2_3$ do not stop at the upper surface of the top plate TP, such that central portions of the vias $V2_2$ and $V2_3$ do not contact the top plate TP, does not significantly affect the electrical resistance of the connection between the top plate TP and the vias $V2_2$ and $V2_3$. Further, if lower connection resistance between the top plate TP and the electrodes $M3_2$ and $M3_3$ is desired, more vias between the electrodes $M3_2$ and $M3_3$ and the top plate TP may be incorporated. For example, there may be one via per each ten picofarads of capacitance of the resultant metal-insulator-metal capacitor formed by the process.

Although FIG. 1J depicts vias $V2_2$ and $V2_3$ making contact at each end of the top plate TP, it should be appreciated that electrical contact need not be made at both ends, but may be made at only one end or the other. Thus, embodiments of the structure may include via $V2_2$ but not via $V2_3$, or via $V2_3$ but not via $V2_2$.

Figure 3:
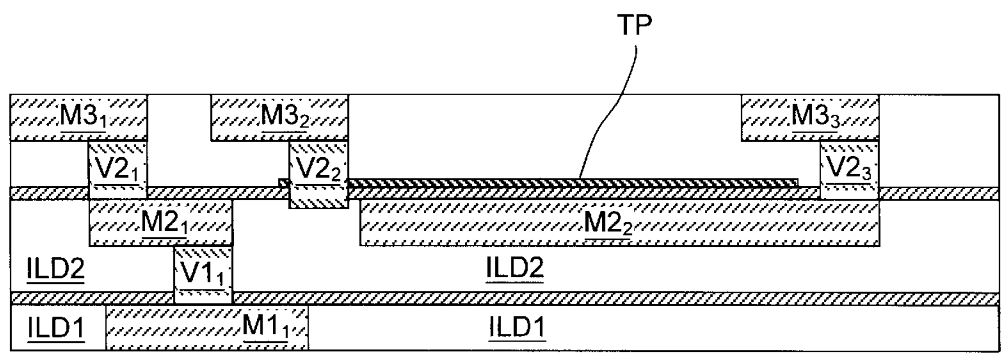
FIG. 3 depicts a metal-insulator-metal capacitor structure formed using a dual damascene process according to an alternative embodiment of the invention.
Figure 4A:
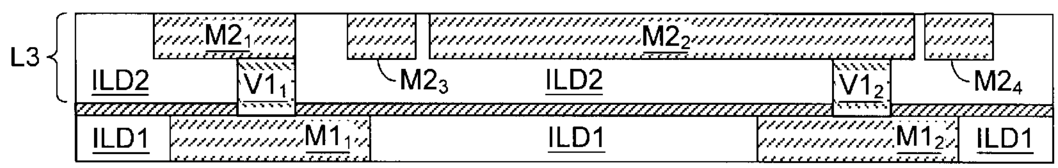
FIGS. 4A–4B depict a metal-insulator-metal capacitor structure formed using a dual damascene process according to another alternative embodiment of the invention.
Figure 4B:
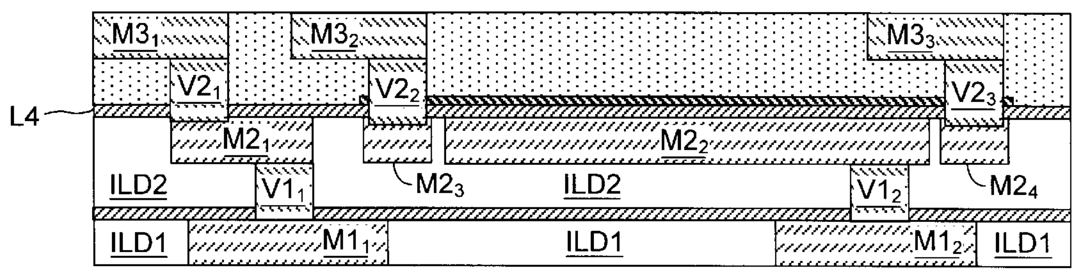

According to the previously described embodiment as shown in FIG. 1J, electrical contact to the capacitor bottom plate $M2_2$ is made at the bottom of the structure through via $V1_2$ and metal section $M1_2$. In an alternative embodiment of the invention as depicted in FIG. 3, electrical contact to the capacitor bottom plate $M2_2$ is made at the top of the structure through via $V2_3$ and metal section $M3_3$. Note that in the embodiment of FIG. 3, the bottom plate $M2_2$ extends beyond the edge of the top plate TP, and that the via $V2_3$ contacts the underlying bottom plate $M2_2$ but not the top plate TP. Except for the differences in the positioning of the top plate TP with respect to the bottom plate $M2_2$, the process steps as described above are also preferably applied in fabricating the structure An alternative embodiment of the process is performed on a structure such as depicted FIG. 4A. This starting structure is generally the same as that depicted in FIG. 1A, except layer L3 includes metal sections $M2_3$ and $M2_4$ on either side of the metal section $M2_2$. The metal sections $M2_3$ and $M2_4$, which are electrically separated from the section $M2_2$ by the dielectric region ILD2, are preferably positioned directly under the location where the vias $V2_2$ and $V2_3$ will be formed. Thus, during the etching of the vias $V2_2$ and $V2_3$ (step 110), if the etching operation punches through the capacitor dielectric layer L4, the bottoms of the vias $V2_2$ and $V2_3$ contact the metal sections $M2_3$ and $M2_4$, respectively, instead of the dielectric material ILD2. Otherwise, the process steps as described above are also preferably applied in fabricating the structure shown in FIG. 4B.

This embodiment addresses situations in which the etchant for the via cavities $VC2_2$ and $VC2_3$ provides poor selectivity between the dielectric material ILD2, such as low-k silicon dioxide, and the materials of L4, L5, and L6. In such a situation the dielectric material ILD2 would tend to pit, making deposition of copper within the via cavities $VC2_2$ and $VC2_3$ relatively difficult. In such a situation the bottoms of the via cavities $VC2_2$ and $VC2_3$ can be filled with a barrier and copper seed. Alternately, the structures $M2_3$ and $M2_4$ of FIG. 4B overcome this issue.

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. A process for forming a capacitive structure that includes an upper layer having a first capacitor electrode section therein, the process comprising:

(a) forming a capacitor dielectric layer adjacent the upper layer, the capacitor dielectric layer covering the first capacitor electrode section, (b) forming a second capacitor electrode layer including a second capacitor electrode section adjacent the capacitor dielectric layer, the second capacitor electrode section at least partially covering the first capacitor electrode section and having an edge portion extending beyond the underlying first capacitor electrode section, the capacitor dielectric layer disposed between the first capacitor electrode section and the second capacitor electrode section, (c) forming an upper dielectric layer adjacent the second capacitor electrode section, (d) selectively removing portions of the upper dielectric layer to form a first via cavity extending through the upper dielectric layer and at least to the edge portion of the second capacitor electrode section, thereby exposing the edge portion of the second capacitor electrode section within the first via cavity, and (e) filling the first via cavity with a via metal, the via metal making electrical connection with the edge portion of the second capacitor electrode section exposed within the first via cavity.

2. The process of claim 1 wherein step (d) further includes selectively removing a portion of the second capacitor electrode section and a portion of the capacitor dielectric layer, such that the first via cavity extends through the second capacitor electrode section and at least partially into the capacitor dielectric layer.

3. The process of claim 1 wherein step (a) further comprises forming the capacitor dielectric layer from silicon nitride.

4. The process of claim 1 wherein step (b) further comprises forming the second capacitor electrode layer from titanium nitride.

5. The process of claim 1 wherein step (b) further comprises forming the second capacitor electrode layer from titanium nitride having a thickness of about 250 angstroms.

6. The process of claim 1 wherein:

step (d) further comprises forming a first trench in the upper dielectric layer adjacent the first via cavity using a dual damascene process, and step (e) further comprises filling the first trench with the via metal to form a first trench metal section having electrical continuity with the second capacitor electrode section.

7. The process of claim 1 wherein the via metal is copper.

8. The process of claim 1 further comprising:

step (b) including forming the second capacitor electrode section such that it does not overly an edge portion of the first capacitor electrode section, (f) selectively removing a second portion of the upper dielectric layer over the edge portion of the first capacitor electrode section to form a second via cavity extending through the upper dielectric layer and exposing the edge portion of the first capacitor electrode section, and (g) filling the second via cavity with the via metal, the via metal making electrical connection with the edge portion of the first capacitor electrode section exposed in step (f).

9. The process of claim 8 wherein:

step (f) further comprises forming a second trench in the upper dielectric layer adjacent the second via cavity using a dual damascene process, and step (g) further comprises filling the second trench with the via metal to form a second trench metal section having electrical continuity with the first capacitor electrode section.

10. The process of claim 1 wherein step (b) further comprises:

(b1) forming a capacitor electrode mask adjacent the second capacitor electrode layer and covering only the second capacitor electrode section, and (b2) etching the second capacitor electrode layer to remove portions of the second capacitor electrode layer not covered by the capacitor electrode mask.

11. A process for forming a capacitive structure that includes an upper layer having a first capacitor electrode section therein, the process comprising:

(a) forming a capacitor dielectric layer adjacent the upper layer, the capacitor dielectric layer covering the first capacitor electrode section, (b) forming a second capacitor electrode layer including a second capacitor electrode section adjacent the capacitor dielectric layer, the second capacitor electrode section at least partially covering the first capacitor electrode section and having an edge portion extending beyond the underlying first capacitor electrode section, the capacitor dielectric layer disposed between the first capacitor electrode section and the second capacitor electrode section, (c) forming an upper dielectric layer adjacent the second capacitor electrode section, (d) selectively removing portions of the upper dielectric layer, the second capacitor electrode section, and the capacitor dielectric layer to form a first via cavity extending through the upper dielectric layer, the edge portion of the second capacitor electrode section, and the capacitor dielectric layer, thereby exposing the edge portion of the second capacitor electrode section within the first via cavity, and (e) forming a first trench in the upper dielectric layer adjacent the first via cavity using a dual damascene process, and (f) filling the first via cavity and the first trench with a via metal, the via metal making electrical connection with the edge portion of the second capacitor electrode section exposed within the first via cavity.

12. The process of claim 11 wherein step (a) further comprises forming the capacitor dielectric layer from silicon nitride.

13. The process of claim 11 wherein step (b) further comprises forming the second capacitor electrode layer from titanium nitride.

14. The process of claim 11 wherein step (b) further comprises forming the second capacitor electrode section of titanium nitride having a thickness of about 250 angstroms.

15. A process for forming a capacitive structure that includes an upper layer having a first capacitor electrode section and a via-support metal section therein, the process comprising:

(a) forming a capacitor dielectric layer adjacent the upper layer, the capacitor dielectric layer covering the first capacitor electrode section, (b) forming a second capacitor electrode layer including a second capacitor electrode section adjacent the capacitor dielectric layer, the second capacitor electrode section covering the via-support metal section and at least partially covering the first capacitor electrode section, the second capacitor electrode section having an edge portion extending beyond the underlying first capacitor electrode section, where the capacitor dielectric layer is disposed between the first capacitor electrode section and the second capacitor electrode section, and between the via-support metal section and the second capacitor electrode section, (c) forming an upper dielectric layer adjacent the second capacitor electrode section, (d) selectively removing portions of the upper dielectric layer, the second capacitor electrode section, and the capacitor dielectric layer to form a first via cavity extending through the upper dielectric layer, the edge portion of the second capacitor electrode section, and the capacitor dielectric layer, thereby exposing the edge portion of the second capacitor electrode section within the first via cavity and exposing at least a portion of the underlying via-support metal section, and (e) filling the first via cavity with a via metal, the via metal making electrical connection with the edge portion of the second capacitor electrode section and the via-support metal section exposed in step (d).

16. A process for forming a capacitive structure that includes an upper layer having a first capacitor electrode section formed from copper therein, the process comprising:

(a) forming a capacitor dielectric layer adjacent the upper layer, the capacitor dielectric layer formed from silicon nitride and covering the first capacitor electrode section, (b) forming a second capacitor electrode layer from titanium nitride having a thickness of about 250 angstroms, the second capacitor electrode layer including a second capacitor electrode section adjacent the capacitor dielectric layer, the second capacitor electrode section at least partially covering the first capacitor electrode section and having an edge portion extending, beyond the underlying first capacitor electrode section, the capacitor dielectric layer disposed between the first capacitor electrode section and the second capacitor electrode section, (c) forming an upper dielectric layer adjacent the second capacitor electrode section, (d) selectively removing portions of the upper dielectric layer and the second capacitor electrode section to form a first via cavity extending through the upper dielectric layer and the edge portion of the second capacitor electrode section, thereby exposing the edge portion of the second capacitor electrode section within the first via cavity, and (e) filling the first via cavity with copper, the copper making electrical connection with the edge portion of the second capacitor electrode section exposed within the first via cavity.

* * * * *